United States Patent [19]

Crooks

[11] 3,939,305
[45] Feb. 17, 1976

[54] REVERBERATION MIXER CIRCUIT
[75] Inventor: Robert Clement Allen Crooks, Arcadia, Calif.
[73] Assignee: Norlin Music, Inc., Lincolnwood, Ill.
[22] Filed: Sept. 30, 1974
[21] Appl. No.: 510,366

[52] U.S. Cl. .............................................. 179/1 J
[51] Int. Cl.² ......................................... H04R 3/00
[58] Field of Search ............................ 179/1 J, 1 M

[56] References Cited
UNITED STATES PATENTS

| | | | |
|---|---|---|---|
| 2,942,070 | 6/1960 | Hammond et al. | 179/1 J |
| 3,221,092 | 11/1965 | Rogers | 179/1 J |
| 3,719,782 | 3/1973 | Barnum | 179/1 J |

OTHER PUBLICATIONS

1 Dezettel, "Reverberation", Electronic Technician, Mar. 1961.

Primary Examiner—Kathleen H. Claffy
Assistant Examiner—E. S. Kemeny
Attorney, Agent, or Firm—Ronald J. Kransdorf

[57] ABSTRACT

This invention relates to a circuit for mixing a direct audio signal with a reverberation signal. The circuit includes an amplitude control for the reverberation signal and an active gain producing element such as, for example, a field effect transistor (FET). The direct signal is applied to the element in a manner such that this signal is amplified by the element. The reverberation signal is applied to the element through the reverberation amplitude control in a manner such that, as the amplitude for the reverberation signal is increased by the amplitude control, the gain of the element for the direct signal is reduced, thus maintaining uniform output volume. Thus, the output from the element has both a direct signal component and a reverberation signal component, the direct signal component decreasing as the reverberation signal component increases.

6 Claims, 1 Drawing Figure

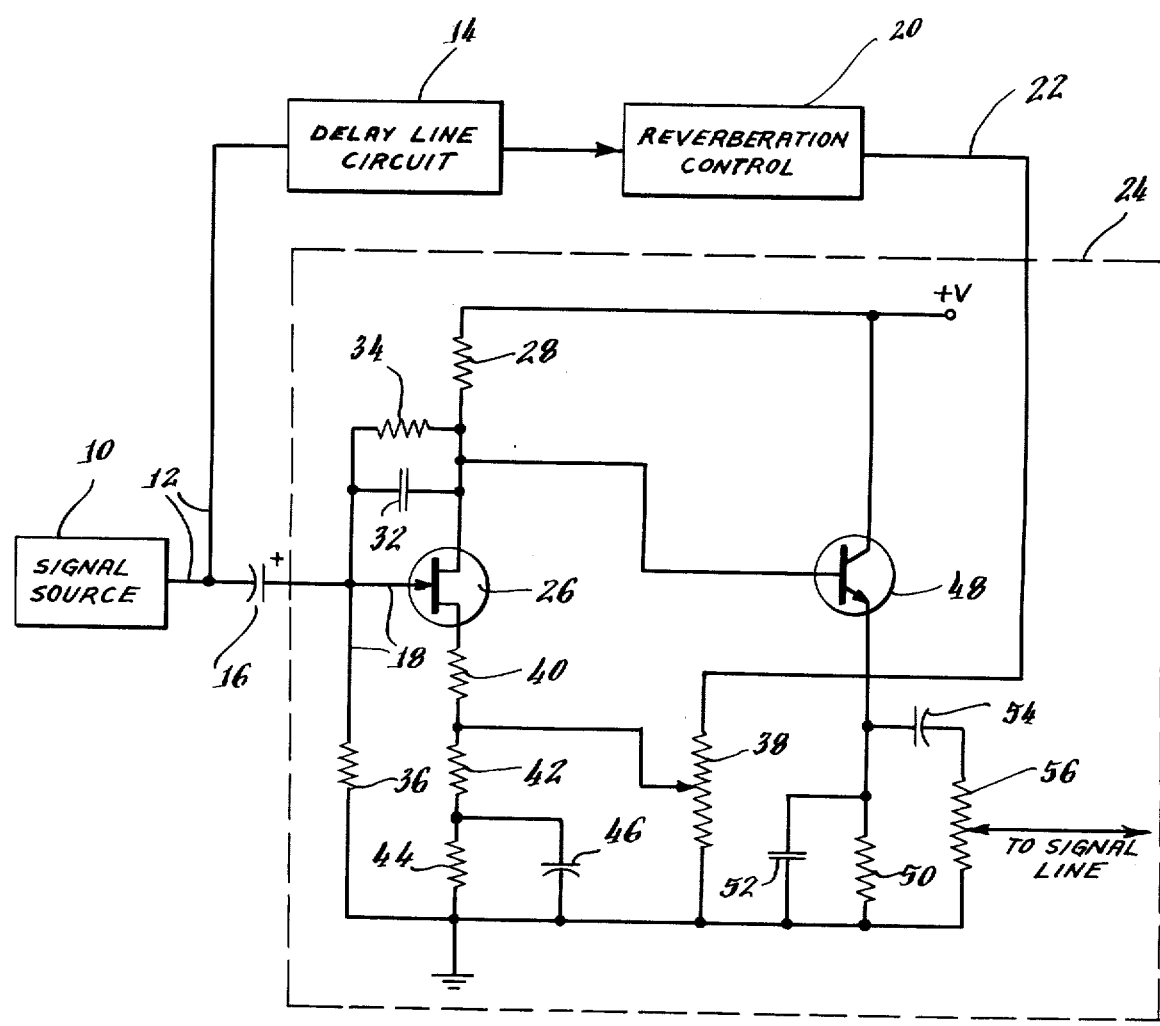

REVERBERATION MIXER CIRCUIT

BACKGROUND

1. Field of the Invention

This invention relates to audio control systems and more particularly to a circuit for mixing a direct audio signal with a reverberation signal component thereof.

2. The Prior Art

In audio control systems such as, for example, amplifier systems utilized with musical instruments, a reverberation effect is frequently provided. This effect is achieved by mixing the direct audio signal with a delayed component of the signal. Normally, there is an undesirable volume increase in the output sound from the system as reverberation signal is added. A more aesthetically pleasing sound is obtained if the volume of the direct signal decreases as the volume of the reverberation signal increases so as to maintain a substantially uniform output volume. The volume of the direct signal may, for example, be reduced by up to 50% when the system controls are set for full reverberation signal.

Heretofore, the only way that the effect indicated above could be obtained was to apply the direct and reverberation signals to opposite ends of a potentiometer, the tap on the potentiometer serving as a volume control for the reverberation signal. A major disadvantage of this type of reverberation mixer circuit is that the potentiometer must have a fairly large resistance to substantially cut off the reverberation signal when the potentiometer is set for zero reverberation. However, with a large-resistance potentiometer, there is significant insertion loss for both the direct and reverberation signals. A need therefore exists for an improved reverberation mixer circuit which permits the desired effect of reducing the amplitude of the direct signal as the amplitude of the reverberation signal is increased without causing a significant insertion loss for either of the signals.

SUMMARY OF THE PRESENT INVENTION

This invention provides a circuit for mixing a direct signal with a reverberation signal which circuit includes an amplitude control means variably positionable for controlling the amplitude of the reverberation signal and an active gainproducing element which functions as a mixer means. The direct signal is applied to the element in a manner such that this signal is amplified by the element. The reverberation signal as it appears at the output from the control means is applied to the element, the element mixing this signal with the direct signal to obtain a composite output. The reverberation signal is applied to the element in a manner such that, as the amplitude for the reverberation signal is increased by the control means, the gain of the direct signal component of the composite output is reduced.

The foregoing and other objects, features and advantages of the invention will be apparent from the following more particular description of a preferred embodiment of the invention as illustrated in the accompanying drawing.

BRIEF DESCRIPTION OF THE DRAWINGS

The single FIGURE is a semiblock schematic diagram of a preferred embodiment of the invention.

DETAILED DESCRIPTION

Referring now to the FIGURE, a signal source 10 generates an output on a line 12 which is applied to a standard delay line circuit 14 and through an isolation capacitor 16 to a line 18. Signal source 10 is a source of audio signals and may, for example, be the output from the last stage of an amplifier, the input to which may be the audio output signal from an electric guitar or other electronic musical instrument. The output from delay circuit 14 is applied through standard reverberation control circuits 20 to a line 22. Circuits 20 include various signal shaping, amplifying and other control circuitry.

Lines 18 and 22 are inputs to the mixer and amplifier circuit 24 of this invention. Line 18 is connected to the gate or control input of a field-effect transistor (FET) 26. The drain electrode of FET 26 is connected through a resistor 28 to a source of positive potential. The gate and the drain are connected through a frequency compensating capacitor 32. Bias potentials for the gate and drain are controlled by resistors 34 and 36 in addition to the resistor 28.

Line 22 is connected through reverberation volume control potentiometer 38 to ground. The source electrode of FET 26 is connected to ground through a resistance chain including resistors 40, 42, and 44, resistor 44 being shunted by a high frequency bypass capacitor 46. The tap of potentiometer 38 is connected to the junction of resistors 40 and 42.

The drain of FET 26, which is the output electrode from the FET, is connected to the control input of amplifier transistor 48. The collector of this transistor is connected to the positive potential source and the emitter of this transistor is connected to ground through resistor 50, a high frequency bypass capacitor 52 being provided for this resistor. The emitter of transistor 48 is also connected through DC isolation capacitor 54 and master volume control potentiometer 56 to ground. The tap on potentiometer 56 is connected to the signal output line from the system.

In operation, the reverberation signal is at a minimum, being essentially cut off, when the tap on potentiometer 38 is on the ground or lower side of the potentiometer, and is at a maximum, being roughly equal to the direct signal, when the tap is at the top-side of the potentiometer. With potentiometer 38 set for zero reverberation, resistors 42 and 44 are effectively bypassed or shunted through the potentiometer. This decrease in the resistance in series with FET 26 increases the gain between the gate and drain of the FET to maximize the amplitude of the direct signal. Conversely, with potentiometer 38 in its maximum reverberation position, the reverberation signal is applied to the source electrode of FET 26 without any attenuation in potentiometer 38. The high resistance of potentiometer 38 in this situation results in resistors 42 and 44 being the lowest resistance path to ground from the source electrode. This increase in the FET series resistance to ground reduces the gate-to-drain gain of the FET, effectively reducing the direct signal component of the FET output. At positions of potentiometer 38 intermediate the two extremes indicated above, the reverberation signal component of the output from the FET increases as the tap moves up the potentiometer, while the gain in the FET for the direct signal component, and thus the volume for this component, decreases as the tap on the potentiometer is moved up. By proper selection of component values, the change in the amplitude of direct component of the output may be adjusted to be substantially equal to the change in the reverberation component of the output so that the amplitude of the composite output signal from the FET remains substantially constant.

Since the direct signal is not applied through potentiometer 38 and the reverberation signal is applied through this potentiometer only when it is desired to be attenuated, the potentiometer may have the high resistance required to fully attenuate the reverberation signal without introducing undesired insertion loss for either the direct or the reverberation signals. The desired, substantially uniform output volume for the system as reverberation is increased or reduced is thus achieved without introducing any undesired insertion loss for either the direct or reverberation signal.

While for the preferred embodiment of the invention shown in the FIGURE, an FET has been utilized for the mixing function, primarily becuase of its low impedance characteristics, other equivalent gain-producing elements, including various other types of transistors, could be utilized for performing this function. Similarly, each of the other components of the preferred embodiments of the invention could be replaced with elements performing a comparable function. Thus, while the invention has been particularly shown and described above with reference to a preferred embodiment, the foregoing and other changes in form and detail may be made therein without departing from the spirit and scope of the invention.

What is claimed is:

1. A circuit for mixing a direct signal with a reverberation signal comprising:
   an active gain-producing element;
   means for applying the direct signal to said element in a manner such that said signal is amplified by the element;
   amplitude control means for said reverberation signal;
   and means for connecting said control means to said element in a manner such that, as the amplitude for the reverberation signal is increased by said control means, the gain of the element for the direct signal is reduced, the reverberation signal being applied to the element through the amplitude control means and the means for connecting said control means to the element;
   whereby the output from the element has a direct signal component and a reverberation signal component, the direct signal component decreasing as the reverberation signal component increases.

2. A circuit as claimed in claim 1 including a resistance path to ground connected in series with said element; and
   wherein said amplitude control means is a variable resistor, said variable resistor being connected to partially shunt said resistance path, maximum shunting occurring when the variable resistor is set for minimum reverberation amplitude and minimum shunting occurring when the variable resistor is set for maximum reverberation.

3. A circuit as claimed in claim 1 wherein said element is a field effect transistor (FET), the direct signal being applied to the gate input of the FET, the control means being connected to the FET source input, and the output from the element being derived from the FET drain.

4. A circuit as claimed in claim 3 including a resistance circuit connected between the source of the said FET and ground; and
   wherein said amplitude control means is a variable resistor, said variable resistor being connected to partially shunt said resistance circuit, maximum shunting occurring when the variable resistor is set for minimum reverberation amplitude and minimum shunting occurring when the variable resistor is set for maximum reverberation, the gate to drain gain of said FET increasing as the portion of the resistance circuit which is shunted increases.

5. A circuit for mixing a direct signal with a reverberation signal comprising:
   control means variably positionable for controlling the amplitude of said reverberation signal; and
   mixer means adapted for receiving said direct signal and for receiving said reverberation signal as it appears at the output of said control means, for mixing the received signals to obtain a composite output and for applying a controlled gain to the direct signal component of the composite output, said gain decreasing as the position of said control means is varied to increase the amplitude of the reverberation signal, and increasing as the position of the control means is varied to decrease the amplitude of the reverberation signal.

6. A circuit as claimed in claim 5 wherein said mixer means is a field effect transistor (FET) circuit, the direct signal being applied to the gate of the FET, the output of the control means being applied to the FET source input, and the output from the mixer means being obtained from the FET drain.

* * * * *